United States Patent
Yoon et al.

(10) Patent No.: US 10,147,897 B2
(45) Date of Patent: Dec. 4, 2018

(54) SYNAPTIC TRANSISTOR BASED ON METAL NANO-SHEET AND METHOD OF MANUFACTURING THE SAME

(71) Applicant: GWANGJU INSTITUTE OF SCIENCE AND TECHNOLOGY, Gwangju (KR)

(72) Inventors: Myung Han Yoon, Gwangju (KR); Chang Hyun Kim, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 0 days.

(21) Appl. No.: 15/703,366

(22) Filed: Sep. 13, 2017

(65) Prior Publication Data
US 2018/0083212 A1    Mar. 22, 2018

(30) Foreign Application Priority Data
Sep. 13, 2016   (KR) .................. 10-2016-0117759

(51) Int. Cl.
*H01L 51/05* (2006.01)
*H01L 51/00* (2006.01)
*H01L 29/788* (2006.01)
*H01L 21/28* (2006.01)

(52) U.S. Cl.
CPC .... *H01L 51/0554* (2013.01); *H01L 21/28273* (2013.01); *H01L 29/7881* (2013.01); *H01L 51/0021* (2013.01); *H01L 51/0516* (2013.01)

(58) Field of Classification Search
None
See application file for complete search history.

(56) References Cited

U.S. PATENT DOCUMENTS

| | | | |
|---|---|---|---|
| 2013/0181191 A1* | 7/2013 | Hwang | H01L 51/0093 257/40 |
| 2014/0213049 A1* | 7/2014 | Strenz | H01L 21/28273 438/593 |
| 2017/0104160 A1* | 4/2017 | Facchetti | H01L 51/0036 |
| 2017/0271381 A1* | 9/2017 | Sone | G09G 3/2092 |

* cited by examiner

*Primary Examiner* — Joseph Schoenholtz
(74) *Attorney, Agent, or Firm* — Hauptman Ham, LLP

(57) ABSTRACT

A synaptic transistor based on a metal nano-sheet and a method thereof are provided. A self-assembled floating gate layer is formed. The floating gate layer prevents leakage of electric charges transmitted from a channel layer, and also temporarily stores the transmitted electric charge. Thus, the synaptic transistor may be used as an effective memory for storing.

8 Claims, 4 Drawing Sheets

60 : SOURCE ELECTRODE LAYER

70 : DRAIN ELECTRODE LAYER

50 : CHANNEL LAYER

40 : FLOATING GATE LAYER

30 : INSULATING LAYER

20 : BUFFER LAYER

10 : GATE ELECTRODE LAYER

60 : SOURCE ELECTRODE LAYER

70 : DRAIN ELECTRODE LAYER

50 : CHANNEL LAYER

40 : FLOATING GATE LAYER

30 : INSULATING LAYER

20 : BUFFER LAYER

10 : GATE ELECTRODE LAYER

SYNAPTIC TRANSISTOR BASED ON METAL NANO-SHEET AND METHOD OF MANUFACTURING THE SAME

CROSS-REFERENCE TO RELATED APPLICATION(S)

This application claims priority under 35 USC § 119 to Korean Patent Applications No. 10-2016-0117759, filed on Sep. 13, 2016 in the Korean Intellectual Property Office (KIPO), the contents of which are incorporated herein in its entirety by reference.

BACKGROUND

1. Technical Field

The present invention relates to a synaptic transistor, and more particularly, to a synaptic transistor based on a metal nano-sheet and a method of manufacturing the same.

2. Description of the Related Art

Hundred billions of neurons exist in a brain, and the brain is composed of a complex neural network. The neuron enables intellectual ability such as education, memory, etc., through synapse, in which one neuron exchanges signals with thousands of other neurons. Also, the neuron is a structural and functional unit of a nervous system, and is a basic unit for transmitting information. The synapse is a connecting portion between neurons. That is, the synapse is the connecting portion between axon of one neuron and dendrite of another neuron.

A neuromorphic system imitating an artificial system is actively researched. In order to realize the neuromorphic system, a synaptic device, which is a basic unit of the neuromorphic, is important. The synaptic device performs similar function as the synapse of the brain, and enables education and cognition functions of the neuromorphic system. Conventional various memory based devices such as a flash memory, a SRAM, a DRAM, etc., may be used for the synaptic device, but various synaptic devices such as a Phase Change Memory (PCM), a Ferroelectric Random Access Memory (FeRAM), a Resistance Random Access Memory (ReRAM), etc., have been studied. In particular, in order to realize a highly integrated synaptic device, the synaptic device is a two-terminal device, and the two-terminal device should have a cross-point array shape. However, when the synaptic device has the cross-point array shape, current and voltage are applied to unselected synaptic devices, and thus, a sneak-current is a problem of the conventional synaptic device.

SUMMARY

The purpose of the present invention is to provide a metal nano-sheet based synaptic transistor.

The purpose of the present invention is to provide a method of manufacturing the above-mentioned synaptic transistor.

In order to achieve the above-mentioned purpose of the present invention, a synaptic transistor based on a metal nano-sheet includes a gate electrode layer, a buffer layer disposed on the gate electrode layer, an insulating layer disposed on the buffer layer, a self-assembled floating gate layer disposed on the insulating layer, a source electrode layer disposed on one side of the channel layer, and a drain electrode layer disposed on the other side of the channel layer. The drain electrode layer is spaced apart from the source electrode layer.

The self-assembled floating gate layer may include at least one naturally oxidizing material selected from the group consisting of silver (Ag), copper (Cu), and aluminum (Al).

The self-assembled floating gate layer may include a metal oxide layer disposed on an external surface thereof and a metal layer disposed inside thereof.

A metal layer disposed inside of the self-assembled floating gate layer may include a floating electrode configured to store an electric charge transmitted from a channel layer.

A metal oxide layer disposed outer portion of the self-assembled floating gate layer may be used as both of a tunneling layer and a blocking insulating layer.

In order to achieve the above-mentioned purpose of the present invention, a method of manufacturing a synaptic transistor based on a metal nano-sheet is provided as follows. A gate electrode layer is prepared. A buffer layer is formed on the gate electrode layer. An insulating layer is formed on the buffer layer. A self-assembled floating gate layer is formed on the insulating layer. A channel layer is formed on the self-assembled floating gate layer. A source electrode layer is formed on one side of the channel layer. A drain electrode layer is formed on the other side of the channel layer, and the drain electrode layer is spaced apart from the source electrode layer.

In the forming the self-assembled floating gate layer, the self-assembled floating gate layer may include at least one naturally oxidizing material selected from the group consisting of silver (Ag), copper (Cu), and aluminum (Al).

In the forming the self-assembled floating gate layer, the self-assembled floating gate layer may include a metal oxide layer disposed on an external surface thereof and a metal layer disposed on an internal surface thereof.

In the forming the self-assembled floating gate layer, the self-assembled floating gate layer may be formed to have an aluminum (Al) layer at a thickness of 3 nm to 10 nm through a physical vapor deposition.

In the forming the drain electrode layer on the other side of the channel layer, which is spaced apart from the source electrode layer, the source electrode layer and the drain electrode layer may be formed from a metal thin film.

According to the metal nano-sheet based synaptic transistor and the method of manufacturing the synaptic transistor, an ultra-thin and high planarity metal film of 2-dimensional type is formed, and an oxidized memory layer makes contact with a semiconductor layer to manufacture the transistor in a simple method without loss of electron transporting capability.

Also, the synaptic transistor using the metal nano-sheet includes a neuromorphic device array of a flexible transparent plastic type, thereby greatly improving economic efficiency.

Also, the nano-sheet is structurally controlled so that channels of the synaptic transistors may be electrically isolated. Thus, the channel may electrically communicate with the metal layer by effect of a floating gate layer.

Also, the nano-sheet may include eco-friend metal such as silver, copper, aluminum, etc., and degree of freedom may be increased in the manufacturing process of the channel, and the nano-sheet may be used as high quality organic and inorganic semiconductor materials through solution and deposition processes.

Also, electron transporting performance is uniformized, thereby realizing short-term plasticity of a biological synapse in rapid pulse operation.

The technical effects of the present invention are not limited by the above-mentioned, and it would be obvious to those of ordinary skill in the art that other technical effects which are not mentioned also exist.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
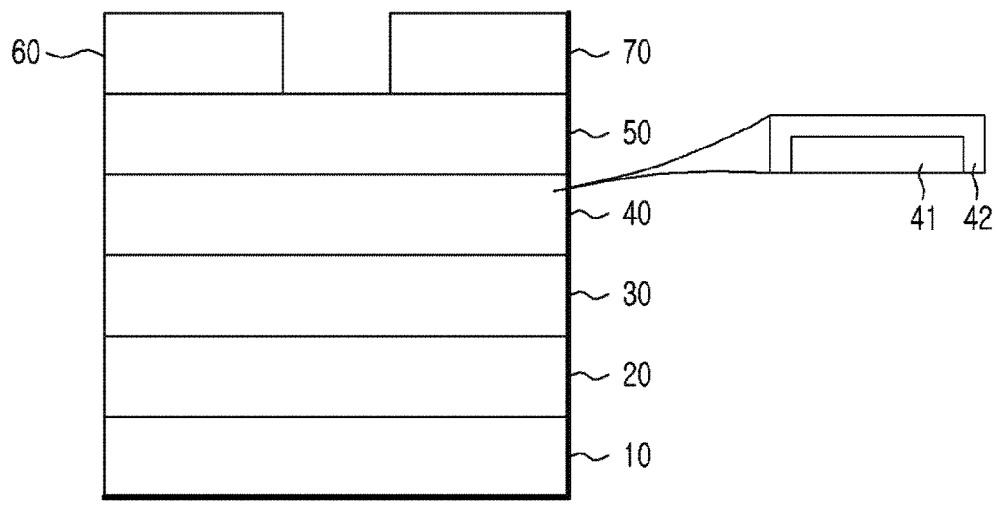
FIG. 1 is a view illustrating a structure of a synaptic transistor based on a metal nano-sheet according to one embodiment of the present invention.

Hereinafter, embodiments of the present invention will be explained with reference to accompanying drawings.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. Thus, in the drawings, the thicknesses of layers and regions are expressed for convenience of the explanation, and may be exaggerated with respect to an actual physical thickness. In numbering reference numerals to the structural parts of each drawing, like numerals may refer to like elements throughout the description of the figures although the reference numerals are displayed in different drawings.

Embodiment

FIG. 1 is a view illustrating a structure of a synaptic transistor based on a metal nano-sheet according to one embodiment of the present invention.

Referring to FIG. 1, the structure of the synaptic transistor based on the metal nano-sheet is described.

Firstly, a gate metal layer 10 is disposed. For example, the gate metal layer 10 may include various materials, which may support a structure thereon as a plate. Also, the gate electrode layer 10 may function as a switch, which turns on or turns off a current flowing between a source electrode layer 60 and a drain electrode layer 70. However, the gate electrode layer 10 may include an additional coating or a dopants implanted thereinto for improving performance of the synaptic transistor. Alternatively, the gate electrode layer 10 may include polyethylene terephthalate (PET) coated by indium tin oxide (ITO).

A buffer layer 20 is disposed on the gate electrode layer 10. For example, the buffer layer 20 may be formed through Physical Vapor Deposition (PVD), which includes sputtering, Pulse Laser Deposition (PLD), thermal evaporation, electron-beam evaporation, etc., or Chemical Vapor Deposition (CVD). Also, the buffer layer 20 improves surface uniformity and stability of the gate electrode layer 10. Also, the buffer layer 20 may include at least one selected from the group consisting of highpolymer and oxides. However, the buffer layer 20 may preferably include PEDOT:PSS.

Then, an insulating layer 30 is disposed on the buffer layer 20. For example, the insulating layer 30 may be formed through Physical Vapor Deposition (PVD), which includes sputtering, Pulse Laser Deposition (PLD), thermal evaporation, electron-beam evaporation, etc., or Chemical Vapor Deposition (CVD). Also, the insulating layer 30 may perform as a capacitor, through which an electric field formed by a gate voltage is applied. For example, the insulating layer 30 may include at least one bond selected from the group consisting of ether bond (—O—), ketone bond (—CO—), ester bond (—COO—), amid bond (—NHCO—, —CONH—), urethane bond (—NHCOO—, —OCONH—), and a combination thereof. However, the insulating layer 30 may include poly(methyl methacrylate) (PMMA).

A self-assembled floating gate layer 40 is disposed on the insulating layer 30. The self-assembled floating gate layer 40 includes a metal oxide layer 42 of a floating gate and a metal layer 41 of the floating gate. The metal oxide layer 42 is formed by naturally oxidized metal oxide disposed on an external surface of the floating gate. The metal layer 41 is disposed inside of the floating gate and is not oxidized to remain as a metal. Also, the self-assembled floating gate layer 40 may be formed through Physical Vapor Deposition (PVD), which includes sputtering, Pulse Laser Deposition (PLD), thermal evaporation, electron-beam evaporation, etc., Molecular Beam Epitaxy (MBE), or Chemical Vapor Deposition (CVD). Also, the self-assembled floating gate layer 40 may include silver (Ag), copper (Cu), or aluminum (Al). The self-assembled floating gate layer 40 may also include a material, which may become metal oxide. Preferably, the self-assembled floating gate layer 40 may include aluminum (Al). Also, the self-assembled floating gate layer 40 may include an aluminum (Al) layer, which is not oxidized, and an aluminum (Al) oxide layer, which is naturally oxidized from the aluminum (Al) layer. Also, the aluminum (Al) layer disposed in the self-assembled floating gate layer 40 may be used as a floating electrode, which stores electric charge transmitted from the channel layer 50. Also, the aluminum (Al) oxide layer formed by naturally oxidized on the external surface of the self-assembled floating gate layer 40 may be used as both of a tunneling layer and a blocking insulating layer. For example, when a negative voltage is applied to a gate, the aluminum (Al) oxide layer on the external surface of the self-assembled floating gate electrode 40 is used as the tunneling layer, and thus, electric charge of the channel layer 50 may be transmitted toward the self-assembled floating gate layer 40 and may be trapped in the self-assembled floating gate layer 40. Also, when the gate voltage is not applied, the aluminum oxide layer formed on the external surface of the self-assembled floating gate layer 40 may be used as the blocking layer, which prevents dissipation of the trapped electric charge.

Then, the channel layer 50 is disposed on the self-assembled floating gate layer 40. The channel layer 50 may be formed through Physical Vapor Deposition (PVD), which includes sputtering, Pulse Laser Deposition (PLD), thermal evaporation, electron-beam evaporation, etc., Molecular Beam Epitaxy (MBE), or Chemical Vapor Deposition (CVD). For example, the channel layer 50 may include DNTT. Also, the channel layer 50 may be used as a charge transport layer, through which an electric charge induced by a gate voltage flows by a voltage between the source electrode layer 60 and the drain electrode 70.

Finally, the source electrode layer 60 is disposed on one side of the channel layer 50. Also, the drain electrode layer 70 is disposed on the other side of the channel 50 and is spaced apart from the source electrode layer 60. For example, the source electrode layer 60 and the drain electrode layer 70 may include indium tin oxide (ITO), indium zinc oxide (IZO), molybdenum, copper, aluminum, chromium, tungsten, tantalum, or an alloy thereof. Preferably, the source electrode layer 60 and the drain electrode layer 70 may be formed as a metal thin film. Also, the source electrode layer 60 and the drain electrode layer 70 may include gold (Au). Also, the source electrode layer 60 and the drain electrode layer 70 may be formed through Physical Vapor Deposition (PVD), which includes sputtering, Pulse Laser Deposition (PLD), thermal evaporation, electron-beam evaporation, etc., Molecular Beam Epitaxy (MBE), or Chemical Vapor Deposition (CVD). Thus, the electric charge is applied from the source electrode layer 60 toward the semiconductor and goes toward the drain electrode layer 70, and thus, a channel current flows through the transistor.

Figure 2:
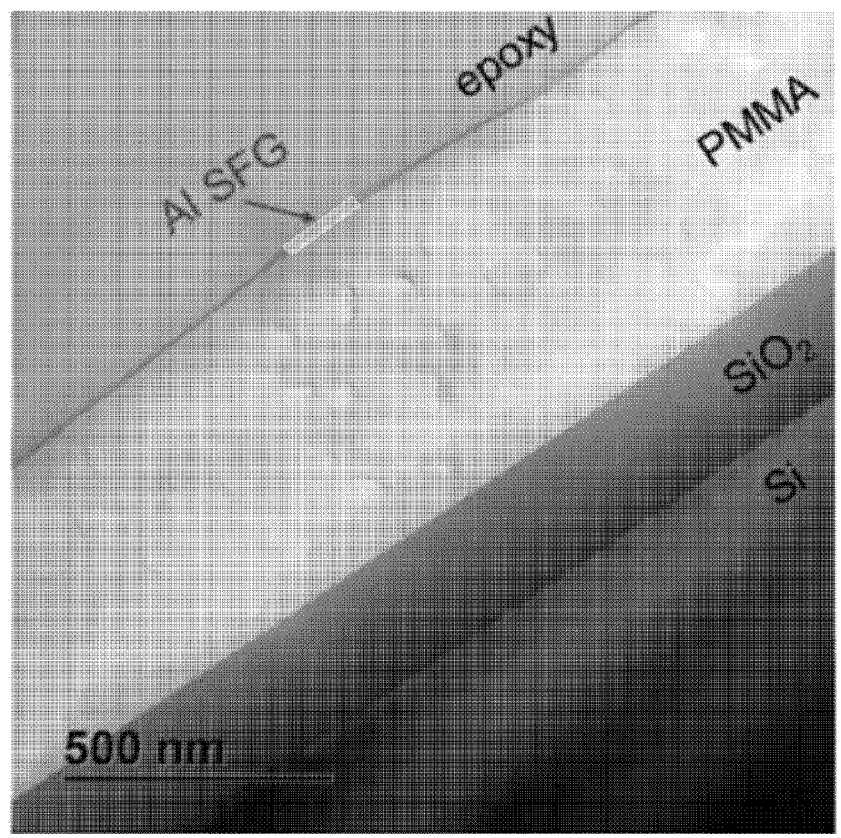
FIG. 2 is a TEM image illustrating a metal nano-sheet according to one embodiment of the present invention.

FIG. 2 is a TEM image illustrating a metal nano-sheet according to one embodiment of the present invention.

Referring to FIG. 2, the TEM image of the metal nano-sheet included in a self-assembled floating gate layer according to the embodiment of the present invention is described.

Firstly, the self-assembled floating gate layer is formed on an insulating PMMA. Also, the self-assembled floating gate layer includes a metal oxide layer and a metal layer. The metal oxide layer is disposed on an external surface of the self-assembled floating gate layer, and is formed by natural oxidization. The metal layer is disposed in the self-assembled floating gate layer, and is protected and not oxidized.

Figure 3:
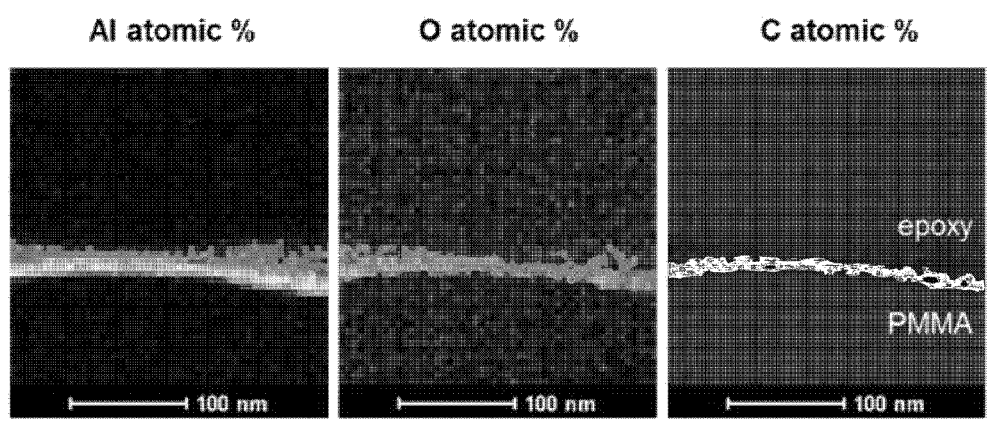
FIG. 3 is images illustrating 2D-EDS analysis result of a self-assembled floating gate layer of a synaptic transistor based on a metal nano-sheet according to one embodiment of the present invention.

FIG. 3 is images illustrating 2D-EDS analysis result of a self-assembled floating gate layer of a synaptic transistor based on a metal nano-sheet according to one embodiment of the present invention.

Referring to FIG. 3, in order to analyze components of layers in the self-assembled floating gate layer of the synaptic transistor based on the metal nano-sheet as images, the 2D-EDS analysis result of the self-assembled floating gate layer with respect to atom % of aluminum (Al), atom % of oxygen (O), and atom % of carbon (C) is described.

Firstly, in the analysis image of Al atom %, the self-assembled floating gate layer forms a discrete boundary between a PMMA layer and an epoxy layer. Also, in the analysis image of 0 atom %, the self-assembled floating gate layer forms a boundary between a PMMA layer and an epoxy layer. However, in the analysis image of the 0 atom %, the boundary between the PMMA layer and the epoxy layer is not discrete. The boundary is not discrete because naturally oxidized oxides exist on an external surface of the self-assembled floating gate layer. Also, in the analysis image of C atom %, the self-assembled floating gate layer forms a discrete boundary between a PMMA layer and an epoxy layer.

Manufacturing Embodiment 1

Manufacturing Synaptic Transistor Based on Metal Nano-Sheet Including Self-Assembled Floating Gate Layer.

Firstly, a buffer layer is formed on a PET substrate having an ITO coating using PEDOT:PSS. The buffer layer is formed through spin coating. For example, the spin coating is performed at 300 RPM during 60 seconds, and is annealed for 10 minutes at a temperature of 100° C., thereby forming the buffer layer. Then, PMMA is spin coated on the buffer layer to form a PMMA insulating layer. For example, the PMMA spin coating is performed at 2,000 RPM during 45 seconds, and is annealed for one hour at a temperature of 120° C., thereby forming the PMMA insulating layer. A self-assembled floating gate layer is formed on the PMMA insulating layer. The self-assembled floating gate layer is formed through physical vapor deposition. For example, in order to form the self-assembled floating gate layer, the physical vapor deposition is performed using aluminum (Al) at a base pressure of $1.0 \times 10^{-6}$ Torr to $5.0 \times 10^{-6}$ in a rate of 0.01 nm/s to 0.05 nm/s to form an aluminum (Al) layer having a thickness of 3 nm to 10 nm. Also, the aluminum (Al) layer formed through the physical vapor deposition is naturally oxidized without plasma surface treatment on the aluminum (Al) surface. Then, a channel layer is formed on the aluminum (Al) layer using DNTT. The channel layer is formed through the DNTT at a base pressure of $3 \times 10^{-6}$ Torr in a rate of 0.02 nm/s to form a DNTT channel layer having a thickness of 50 nm. Then, a source electrode layer and a drain electrode layer are formed on both sides of an upper surface of the DNTT channel layer. The source electrode layer and the drain electrode layer may be formed from a metal thin film, and may be formed as an electrode type through thermal deposition using a mask. For example, the source electrode layer and the drain electrode layer may include metal thin films formed through the thermal deposition and having a thickness of 30 nm.

Figure 4:
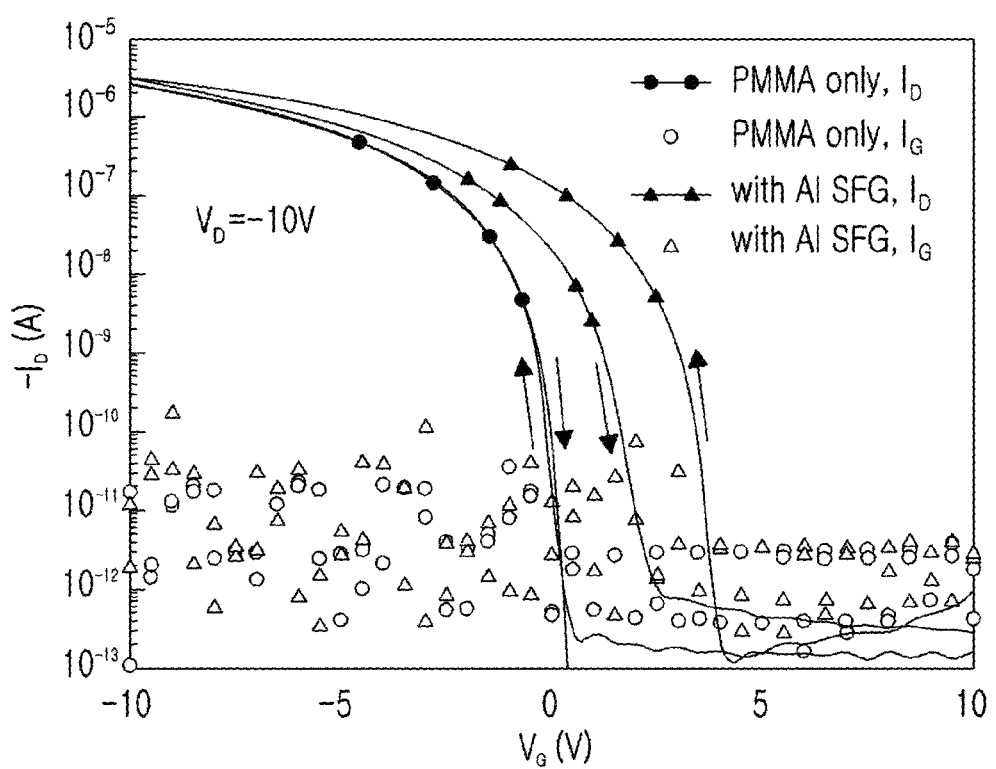
FIG. 4 is a graph illustrating electric characteristics of a synaptic transistor based on a metal nano-sheet according to one embodiment of the present invention.

FIG. 4 is a graph illustrating electric characteristics of a synaptic transistor based on a metal nano-sheet according to one embodiment of the present invention.

Referring to FIG. 4, a graph comparing hysteresis of a current with a voltage based on existence of a self-assembled floating gate layer is described.

The synaptic transistor including the self-assembled floating gate layer has increased hysteresis compared with a transistor without the self-assembled floating gate layer. For example, an aluminum (Al) metal layer disposed in the self-assembled floating gate layer is used as a floating electrode, which stores an electric charge transmitted from a channel layer. Also, an aluminum (Al) metal oxide layer, which is formed by naturally oxidizing an external surface of the self-assembled floating gate layer, is used as both of a tunneling layer and a blocking insulating layers. Thus, when a negative voltage is applied to a gate, the aluminum (Al) metal oxide layer formed on the external surface of the self-assembled floating gate layer is used as the tunneling layer, and thus, the electric charge is transmitted to the floating gate layer and is trapped. Also, when the voltage is not applied to the gate, the aluminum (Al) metal oxide layer on the external surface is used as the blocking layer, which prevents dissipation of the trapped electric charge.

Figure 5:
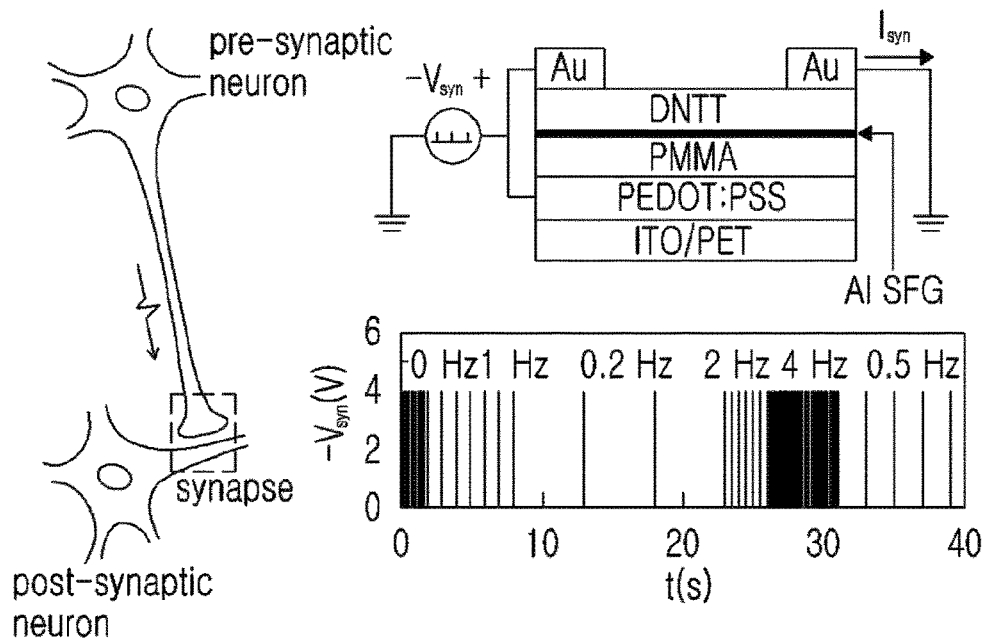
FIGS. 5 and 6 are graphs illustrating performances of a synaptic transistor based on a metal nano-sheet according to one embodiment of the present invention.
Figure 6:
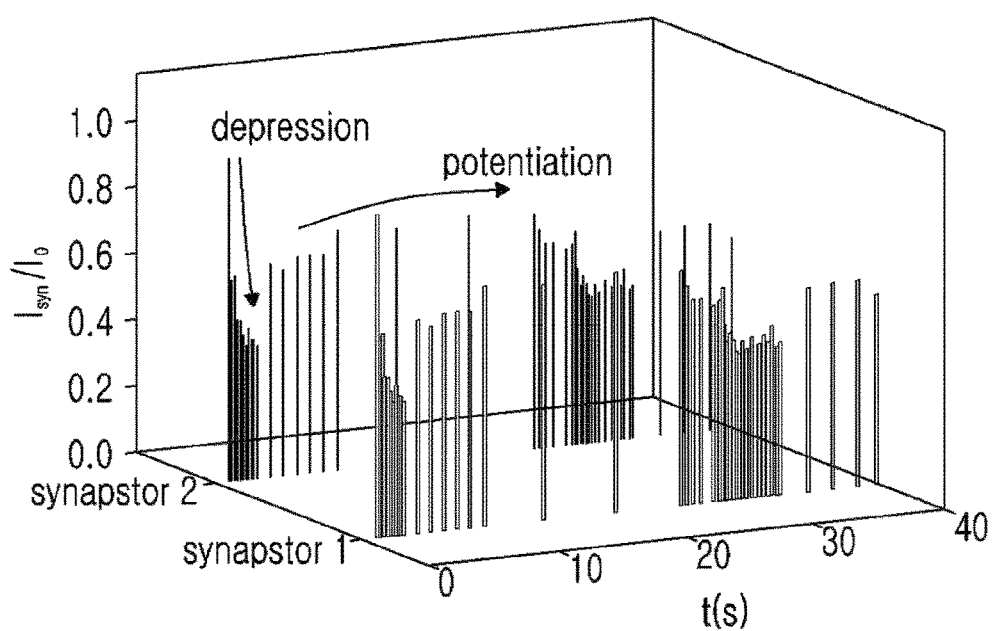

FIGS. 5 and 6 are graphs illustrating performances of a synaptic transistor based on a metal nano-sheet according to one embodiment of the present invention.

Referring to FIG. 5, a cross-sectional view of the synaptic transistor based on the metal nano-sheet and variation of a pulse applied to the synaptic transistor based on the metal nano-sheet are described.

Referring to FIG. 6, a graph illustrating electric characteristics of relative conductivity (Iread/Iinitial, $I_{syn}/I_0$) of a channel based on time difference (Δt), which is a delayed time of input spike, is described.

Intensity of a signal transmitted to a post-neuron synapse is determined based on a stimulus frequency of a pre-synapse spike. For example, when a delayed time difference (Δt) of a spike is greater than a (de-trap) time difference, at which electric charges trapped in a floating gate are leaked toward a channel, the number of free electric charges in the channel is increased, and thus, electric conductivity of the channel is increased. Thus, potentiation of synaptic connection of a biological nervous system is excellently copied. Also, when the delayed time difference (Δt) of a spike is greater than the (de-trap) time difference, the number of the free electric charges are constantly decreased, and thus, the electric conductivity of the channel is decreased. Thus, depression of the synaptic connection of the biological nervous system is excellently copied.

Therefore, according to the synaptic transistor based on the metal nano-sheet including the self-assembled floating gate layer of the present invention, the nano-sheet is structurally controlled so that the channel of the transistor has electric independence. Also, the self-assembled floating gate layer is formed, so that the channel and the metal layer have efficient electric communication. Furthermore, the self-assembled floating gate layer may be formed by various naturally oxidizing materials such as silver (Ag), copper (Cu), aluminum (Al), etc. Also, the self-assembled floating gate layer includes the metal oxide layer and the metal layer, and thus, has physical and chemical stability. Thus, process for forming the channel has high degree of freedom. Also, organic or inorganic semiconductor material of high performance may be used for the channel by solution and deposition processes. Furthermore, a short-term plasticity of the biological synapse may be realized in a rapid pulse operation.

The invention claimed is:

1. A synaptic transistor based on a metal nano-sheet, comprising:
    a gate electrode layer;
    a buffer layer disposed on the gate electrode layer;
    an insulating layer disposed on the buffer layer;
    a self-assembled floating gate layer disposed on the insulating layer;
    a channel layer disposed on the self-assembled floating gate layer;
    a source electrode layer disposed on one side of the channel layer; and
    a drain electrode layer disposed on the other side of the channel layer, the drain electrode layer being spaced apart from the source electrode layer,
    wherein the self-assembled floating gate layer comprises a metal oxide layer disposed on an external surface thereof and formed by naturally oxidization, and a metal layer disposed inside thereof.

2. The synaptic transistor of claim 1, wherein the self-assembled floating gate layer comprises at least one naturally oxidizing material selected from the group consisting of silver (Ag), copper (Cu), and aluminum (Al).

3. The synaptic transistor of claim 1, wherein a metal layer disposed inside of the self-assembled floating gate layer comprises a floating electrode configured to store an electric charge transmitted from a channel layer.

4. The synaptic transistor of claim 1, wherein a metal oxide layer disposed outer portion of the self-assembled floating gate layer is used as both of a tunneling layer and a blocking insulating layer.

5. A method of manufacturing a synaptic transistor based on a metal nano-sheet, comprising:
    preparing a gate electrode layer;
    forming a buffer layer on the gate electrode layer;
    forming an insulating layer on the buffer layer;
    forming a self-assembled floating gate layer on the insulating layer;
    forming a channel layer on the self-assembled floating gate layer;
    forming a source electrode layer on one side of the channel layer; and
    forming a drain electrode layer on the other side of the channel layer, the drain electrode layer being spaced apart from the source electrode layer,
    wherein the self-assembled floating gate layer comprises a metal oxide layer disposed on an external surface thereof and formed by naturally oxidization, and a metal layer disposed inside thereof.

6. The method of claim 5, wherein in the forming the self-assembled floating gate layer, the self-assembled floating gate layer comprises at least one naturally oxidizing material selected from the group consisting of silver (Ag), copper (Cu), and aluminum (Al).

7. The method of claim 5, wherein in the forming the self-assembled floating gate layer, the self-assembled floating gate layer is formed to have an aluminum (Al) layer at a thickness of 3 nm to 10 nm through a physical vapor deposition.

8. The method of claim 5, wherein in the forming the drain electrode layer on the other side of the channel layer, which is spaced apart from the source electrode layer, the source electrode layer and the drain electrode layer are formed from a metal thin film.

* * * * *